United States Patent
Suzuki et al.

(10) Patent No.: US 6,905,952 B2
(45) Date of Patent: Jun. 14, 2005

(54) RECOVERY PROCESSING METHOD OF AN ELECTRODE

(75) Inventors: Takeyuki Suzuki, Yokohama (JP); Yoshinori Wakabayashi, Tokyo (JP)

(73) Assignee: Yamaichi Electronics Co., Ltd., Tokyo (JP)

( * ) Notice: Subject to any disclaimer, the term of this patent is extended or adjusted under 35 U.S.C. 154(b) by 1 day.

(21) Appl. No.: 10/443,813

(22) Filed: May 23, 2003

(65) Prior Publication Data

US 2003/0218252 A1 Nov. 27, 2003

(30) Foreign Application Priority Data

May 27, 2002 (JP) .......................................... 2002-153062
Jan. 9, 2003 (JP) .......................................... 2003-003508

(51) Int. Cl.[7] .............................................. H01L 21/44
(52) U.S. Cl. ...................................................... 438/612
(58) Field of Search .............................. 438/613, 612; 29/592.1, 825, 829, 874, 876

(56) References Cited

FOREIGN PATENT DOCUMENTS

| CN | 90104620.5 | 1/1991 |
|---|---|---|
| EP | 0415896 A1 | 3/1991 |
| JP | 8-96865 | 4/1996 |
| JP | 2000-294043 | 10/2000 |

OTHER PUBLICATIONS

Office Action from Chinese Patent Office in Patent Application No. 031384099, dated Oct. 29, 2004.

*Primary Examiner*—Carl Whitehead, Jr.
*Assistant Examiner*—Monica D. Harrison
(74) *Attorney, Agent, or Firm*—Finnegan, Henderson Farabow, Garrett & Dunner, LLP

(57) ABSTRACT

While a transfer surface 10a of a transfer plate 10 having a predetermined surface roughness is brought into contact with a plurality of bumps 44B on a contact sheet 44 formed on a substrate 44M having the coefficient of linear expansion larger than that of the transfer plate 10 at a predetermined pressure, the substrate 44M and the transfer plate 10 are heated to a predetermined temperature to recover the surface roughness of the bump 44B to a predetermined value.

14 Claims, 19 Drawing Sheets

RECOVERY PROCESSING METHOD OF AN ELECTRODE

This application claims priority from Japanese Patent Application Nos. 2002-153062 filed May 27, 2002 and 2003-003508 filed Jan. 9, 2003, which are incorporated hereinto by reference.

BACKGROUND OF THE INVENTION

1. Field of the Invention

The present invention relates to a recovery processing method of an electrode for recovering a connection surface of an electrode region in an electrode plate for electrically connecting the same to terminals of a semiconductor device, to have a predetermined surface roughness.

2. Description of the Related Art

Generally, in an IC socket or a connector for an electronic equipment, it is desired that terminals of a semiconductor device mounted are assuredly connected to electrodes of a wiring circuit board in the electrical sense. In such a device, as disclosed in Japanese Patent Application Laid-open Nos. 8-96865 (1996) and 2000-294043, it is proposed that a sufficiency of a ceramic sprayed coating by spraying, or micro-projections formed by spraying, an etching treatment sufficient for breaking an oxide film formed on a terminal of a semiconductor device is formed on an electric contact section of a conductive pattern or an end face of a conductive path to be connected to the terminal (electrode) of the semiconductor device. By forming the micro-projections on the electric contact section or the end face of the conductive path in such manner, a mutual contact area is reduced and a contact pressure per unit area increases. Thus, the micro-projections have a effect of easily breaking the oxide film.

As a result, the terminal of the semiconductor device is assuredly connected to the electrode of the wiring circuit board in the electrical sense.

In the above-mentioned IC socket for the electronic equipment, when the electric contact section in the conductive pattern has been repeatedly used, the micro-pattern or the ceramic sprayed coating having wear resistance is also worn due to the contact pressure or the like because a life of the durability has a certain limitations. Accordingly, the electric contact section or the end surface of the conductive path becomes gradually non-irregularity flat surface rather than recovery as the frequency of use increases, which may increases the contact area to result in an insufficient contact pressure. Thus, there may be a case in that the original reliable electric connection is not obtainable as repeating the use thereof.

SUMMARY OF THE INVENTION

In view of the above problems, the present invention has been made to provide a recovery processing method of an electrode for recovering a connection surface of an electrode section in an electrode plate to be electrically connected to a terminal of a semiconductor device so that the connection surface is recovered to have a predetermined surface roughness, which the method is capable of easily and reliably forming a predetermined irregularity on the connection surface of the electrode section in the worn electrode plate.

To achieve the above object, a recovery processing method of an electrode comprises a first step of placing a transfer plate having an irregular surface onto a connection surface of an electrode section formed on an insulation substrate of an electrode plate for the electric connection to a terminal section of a semiconductor device via the connection surface of the electrode section, so that the irregular surface of the transfer plate is brought into contact with the connection surface of the electrode section each other, wherein the transfer plate is formed of a material having the coefficient of linear expansion which is different from that of the insulation substrate of the electrode plate, a second step of heating the transfer plate and the electrode plate at a predetermined temperature for a predetermined period while pressing the transfer plate placed on the connection surface of the electrode section in the first step toward the connection surface of the electrode section at a predetermined pressure, and a third step of separating the transfer plate from the electrode plate to form a predetermined irregularity on the connection surface of the electrode section.

The predetermined temperature and period in the second step may be set in the range from 80 to 150° C. and in the range from 5 to 15 minutes, respectively.

A recovery processing method of an electrode according to the present invention comprises a first step of placing a terminal section of a semiconductor device on a connection surface of an electrode section of an electrode plate having the electrode section formed on an insulation substrate, for the electric connection to the terminal section of the semiconductor device via the connection surface of the electrode section, wherein the electrode section containing, in a base material, a predetermined amount of micro-crystalline materials having a wear resistance higher than that of the base material, and a second step of wearing the connection surface of the electrode plate while contacting the terminal section of the semiconductor with the connection surface of the electrode plate to expose part of the crystalline materials and forming a predetermined irregularity on the connection surface.

The crystalline materials may be formed of palladium or nickel having a hardness higher than that of a copper as the base material and a relatively high electric conductivity.

A recovery processing method of an electrode according to the present invention comprises a first step of placing a transfer plate having an irregular surface onto a connection surface of an electrode section formed on an insulation substrate of an electrode plate having the insulation substrate for the electric connection to a terminal section of a semiconductor device via the connection surface of the electrode section, so that the surface of the transfer plate is brought into contact with the connection surface of the electrode section each other, a second step of relatively moving the transfer plate or the connection surface of the electrode section at least once in either of directions generally parallel to the connection surface at a predetermined distance, while pressing the transfer plate placed on the connection surface of the electrode section in the first step toward the connection surface of the electrode section at a predetermined pressure, and a third step of separating the transfer plate from the electrode plate to form a predetermined irregularity on the connection surface of the electrode section.

In the second step, the electrode plate may be moved relative to the transfer plate by a sliding device for moving the electrode plate generally parallel to the connection surface of the electrode section while supporting the electrode plate thereby.

The pressure in the second step may be in the range from 1 to 100 g per one electrode, and the distance of the relative movement in the second step may be in the range from 1 μm to 1 mm.

As apparent from the above description, according to the recovery processing method of an electrode, since the transfer plate and the electrode plate are heated at the predetermined temperature for the predetermined period toward the connection surface of the electrode section while pressing the transfer plate placed on the connection surface of the electrode section toward the connection surface of the electrode section at the predetermined pressure, both the plates relatively slide to each other due to the difference in the expansion, it is possible to scrape the connection surface of the electrode to have the predetermined surface roughness and thus easily and assuredly form the predetermined irregularity on the worn connection surface of the electrode section in the electrode plate.

The above and other objects, effects, features and advantages of the present invention will become more apparent from the following description of embodiments thereof taken in conjunction with the accompanying drawings.

DETAILED DESCRIPTION OF PREFERRED EMBODIMENTS

Figure 7:
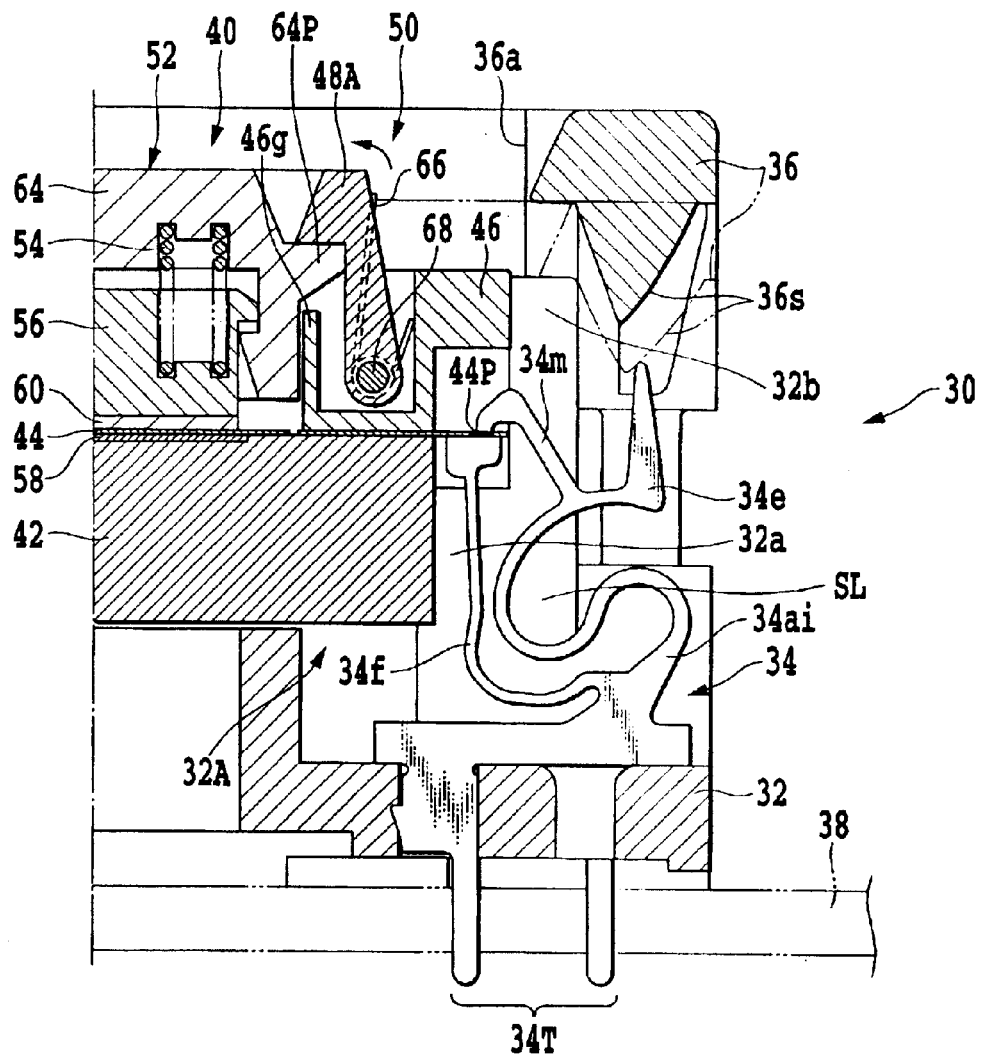
FIG. 7 is a partially sectional view showing an example of a socket for a semiconductor device provided with a contact sheet to which first and second embodiments of a recovery processing method of an electrode according to the present invention is applied.

FIG. 7 illustrates a socket for a semiconductor device provided with a connection electrode plate to which first, second and third embodiments of a recovery processing method of an electrode according to the present invention described below are applied.

In the socket for the semiconductor device shown in FIG. 7, a test for an electric characteristic of the semiconductor device, more specifically, a burn-in test is carried out. The socket for the semiconductor device includes a carrier unit 40 for accommodating a bare chip as a semiconductor device therein and an IC socket 30 for detachably mounting the carrier unit 40 therein.

The IC socket 30 is mainly constructed from a body section 32 having an accommodation portion for accommodating the carrier unit 40 therein, disposed on a printed wiring board 38 for inputting a test signal to the bare chip and outputting a tested output signal from the bare chip, a contact group 34 provided in the body section 32, consisting of a plurality of contacts to be electrically connected to the respective pads of a contact sheet as a connection electrode plate described later, which is an element of the carrier unit 40, and cover member 36 adapted to be movable upward and downward relative to the body section 32, for selectively electrically connecting the respective contact portions of the contact group 34 to the respective pads of the contact sheet.

The body section 32 molded into resinous material is disposed at a predetermined position in correspondence to the electrode section of the printed wiring board 38. As shown in FIG. 7, the body section 32 has an accommodation portion 32A for accommodating the carrier unit 40. The accommodation portion 32A is defined by the inner periphery of a lower base 32a engaged with a lower portion of the base section of the carrier unit 40 described later and the inner periphery of an upper base 32b contiguous to the lower base 32a and engaged with a upper portion of the base section. In the lower base 32a, the contact group 34 is supported. In the lower base 32a and the upper base 32b, slits SL for inserting and receiving the respective contacts 34ai (i=1 to n; n is a positive integer) comprising the contact group 34 are formed.

The contact 34ai (i=1 to n; n is a positive integer) made of metal sheet is constituted of a terminal portion 34T press-fit into the lower base 32a, a fixed contact section 34f contiguous to the terminal portion 34T and electrically connected to the pad of the contact sheet from a lower side, an elastic movable contact portion 34m contiguous to the terminal portion 34T and electrically connected to the pad of the contact sheet from an upper side, and an portion being engaged 34e selectively engageable with a slanted surface of the cover member 36 described later to move rotationally the movable contact portion 34m in the direction that moves away from the fixed contact portion 34f. The portion being engaged 34e is branched from a proximal end of the movable contact portion 34m and extends toward the cover member 36.

In FIG. 7, the respective contacts 34ai are arranged in the generally vertical direction to a paper surface at a given distance in correspondence to the respective pads of the contact sheet 44. Note that only one contact group 34 is shown in FIG. 7, in four contact groups 34 encircling four sides of the accommodation portion 32A.

The cover member 36 molded into resinous material has an opening 36a for allowing the carrier unit 40 to pass therethrough. A frame section forming a peripheral edge of the opening 36a is supported to be movable upward and downward by legs (not shown) guided by a groove (not shown) provided on the outer periphery of the body portion. Note that the cover member 36 is biased by an elastic member not shown to be away from the body section 32. At a lower end of the respective side of the frame section, a slanted surface portion 36s is formed, respectively, which is engaged with a tip end of the portion being engaged 34e of the respective contact 34ai when the cover member 36 is lowered to a predetermined position as shown by a chain double-dashed line in FIG. 7, and moves rotationally the movable contact portion 34m to be away from the fixed contact portion 34f against the elastic force thereof.

When the carrier unit 40 described later is mounted to the accommodation portion 32A of the body section 32 of the IC socket 30, the respective movable contact portion 34m in the contact group 34 moves backwards relative to the accommodation portion 32A to be on standby by pushing down the cover member 36 at a predetermined distance and is maintained in a waiting state. Thereafter, the carrier unit 40 is put into the accommodation portion 32A from above through the opening 36a and placed at a predetermined position. At that time, the fixed contact portion 34f is brought into contact with the lower surface of the pad of the contact sheet 44 in the carrier unit 40.

Next, when the cover member 36 is released from the maintained state, the cover member 36 is subjected to move upward by the resultant force of the recovery force of the above-mentioned elastic body and the elastic force of the portion being engaged 34e of the respective contact 34ai. At that time, the respective movable contact portion 34m of the contact group 34 returns from the above-mentioned waiting position to the original position, and is brought into contact with the upper surface of the pad of the contact sheet 44 in the carrier unit 40. Thereby, as shown in FIG. 7, the respective pads of the contact sheet 44 are electrically connected to the contact group 34.

Figure 8:
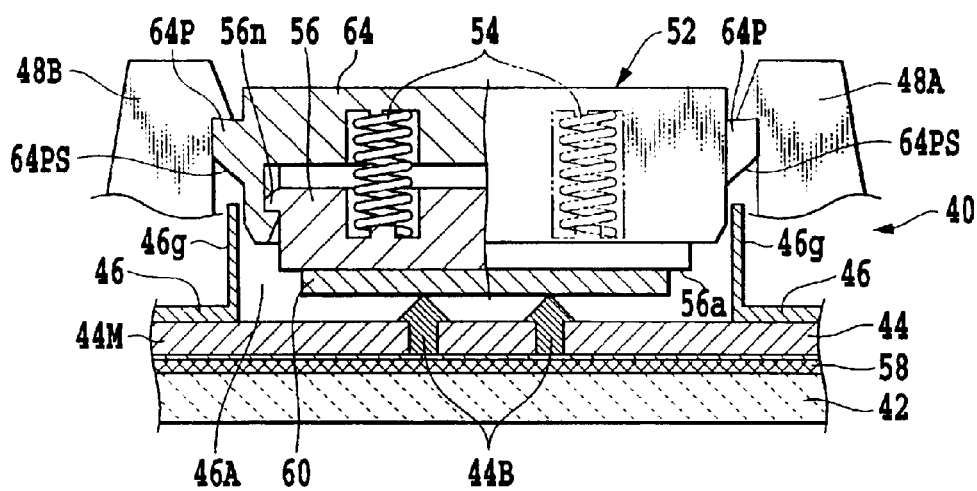
FIG. 8 is a partially sectional view schematically showing a structure of a carrier unit in the embodiment shown in FIG. 7.

As shown in FIG. 8, the carrier unit 40 includes a carrier housing 46 having an accommodation portion 46A for receiving a bare chip 60, the contact sheet 44 placed via an elastic sheet 58 on a base member 42 forming a bottom of the accommodation portion 46A in the carrier housing 46, a pressing covering 52 having a press body 56 for pressing an electrode group of the bare chip 60 to bumps 44B of the contact sheet 44, and a latch mechanism 50 (see FIG. 7) for selectively holding the pressing covering 52 to the carrier housing 46.

As shown in FIG. 8, the pressing covering 52 includes a press body 56 having a pressing surface 56a to be brought into contact with the upper surface of the bare chip 60, a covering body 64 for accommodating a proximal portion of the press body 56, and a plurality of springs 54 arranged in a space between the respective recess in the proximal portion of the press body 56 and a relatively deep recess in the covering body 64 opposite to the former recess, for biasing the press body 56 toward the bare chip 60.

The bare chip 60 of a generally square shape has a predetermined electrode group on a lower surface opposite to the bumps 44B of the contact sheet 44. Now that in FIG. 8, only two of the plurality of bumps 44B are typically illustrated in a relatively exaggerated manner.

The proximal portion of the press body 56 is inserted in a relatively shallow and wide recess in the covering body 64 in a movable manner. At an end of the proximal portion of the press body 56, a plurality of nibs 56n to be engaged with nibs provided at a lower end of the covering body 64 are formed opposite to each other. Thereby, the press body 56 is held by the covering body 64 while being biased by an elastic force of the spring 54.

The covering body 64 has a lug 64p at each of opposite ends thereof to be engaged with a hook member 48A or 48B in the latch mechanism 50. The lugs 64p have slanted surfaces 64 ps for pressing the hook members 48A and 48B to be away from each other by the engagement with the slanted surfaces at tip ends of the hook members 48A and 48B, when the pressing covering 52 is mounted.

The latch mechanism 50 comprises of the hook members 48A and 48B supported at the opposite ends of the carrier housing 46 in a rotatable manner, for holding the covering body 64, a helical torsion spring 66 for biasing each of the hook members 48A and 48B in the direction shown by an arrow in FIG. 7 to engage the same with the lug 64p, and a pin 68 for supporting the helical torsion spring 66.

At each of opposite ends of the carrier housing 46, a guide section 46g is formed, for guiding the outer periphery of a lower portion of the covering body 64 when the pressing covering 52 is mounted. On the periphery of the guide section 46g, each of opposite ends of the pin 68 is supported.

Figure 9:
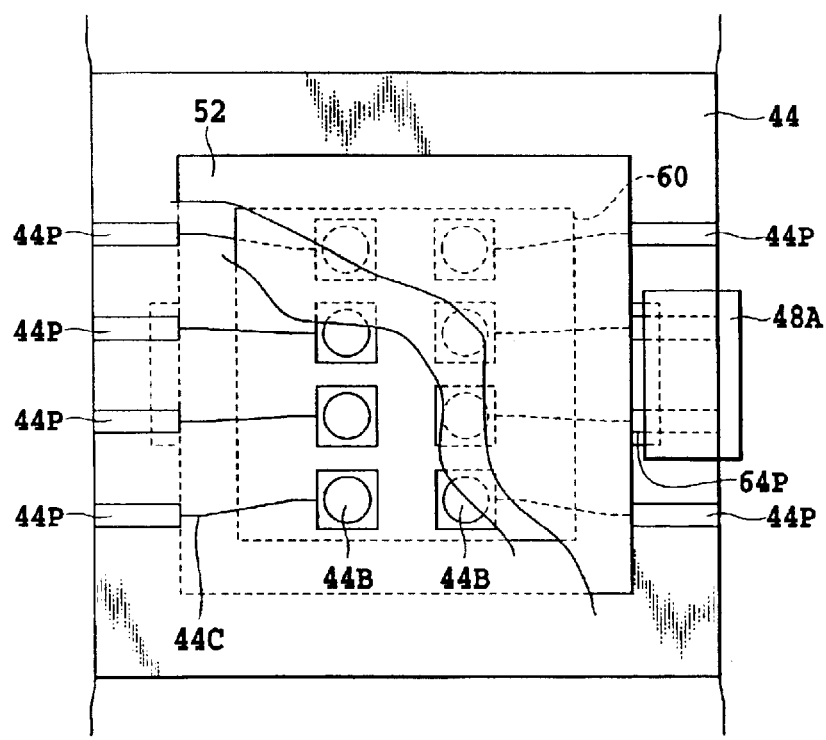
FIG. 9 is a plan view of the embodiment shown in FIG. 8.

As shown in FIGS. 8 and 9, the contact sheet 44 has a plurality of bumps 44B in a substrate 44M arranged in correspondence to the electrode group of the bare chip 60 to be electrically connected to the bumps. Note that, in FIG. 9, of the plurality of bumps 44B in the contact sheet 44, several of them are typically shown in a relatively exaggerated manner.

The respective bump 44B is formed by plating a surface of copper which is a base material with nickel and gold. A tip end of the respective bump 44B is projected only predetermined height from the surface of the substrate 44M.

The substrate 44M is made, for example, of polyimide resin (having a coefficient of linear expansion of $35 \times 10^{-6}/°$ C.) to be a sheet approximately 40 μm in thickness.

The respective bump 44B is connected to a pad 44p via an conductive layer 44c formed of a copper foil as shown in FIG. 9. The pad 44p is formed at each of opposite ends of the substrate 44M projected outward from the base member 42 as shown in FIG. 7.

In this regard, a region in the contact sheet 44 in which the plurality of bumps 44B are formed is supported to be movable relative to the surface of the base member 42 in parallel thereto relatively in a predetermined range.

In such a structure, when the bare chip 60 is mounted in the carrier unit 40, the electrode group of the bare chip 60 is first positioned to the respective bumps 44B of the contact sheet 44 so that the electrode group of the bare chip 60 is brought into contact with the respective bumps 44B. Then, the pressing covering 52 is inserted into the accommodation portion 46A in the carrier housing 46. At tat time, tip ends of the hook members 48A and 48B of the latch mechanism 50 is made to move rotationally to be away from each other against the biasing force of the helical torsion spring 66 by the action of the slanted surface 64p of the covering body 64 in the pressing covering 52. Also, while being guided the outer peripheral surface of the covering body 64 by the inner surface of the guide section 46g, the pressing surface 56a of the press body 56 is pressed on the upper surface of the bare chip 60 against the biasing force of the spring 54.

Subsequently, the hook members 48A and 48B are made to move rotationally so that the tip ends thereof are close to each other by the bias of the helical torsion spring 66, and engaged with the lugs 64p of the covering body 64. As a result, the pressing covering 52 is held by the carrier housing 46.

In a state in which the carrier unit 40 is mounted to the accommodation portion 32A as described above, a test is carried out on the bare chip 60 in a predetermined atmosphere.

Upon such a test, the above-mentioned carrier unit 40 and contact sheet 44 are repeatedly used for a predetermined number of fresh bare chips mounted thereon.

Figure 5A:
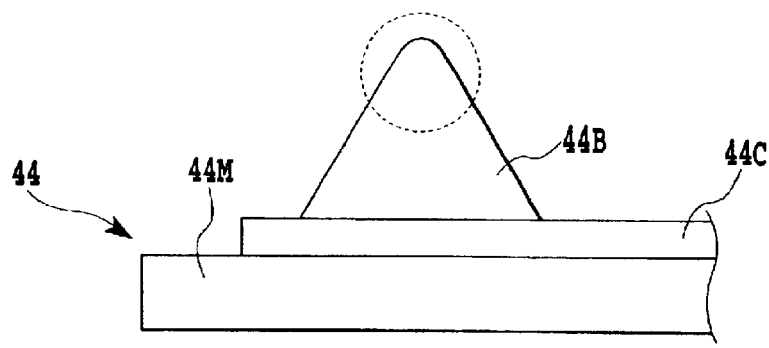
FIGS. 5A, 5B and 5C are views of illustrations made available for explaining the respective steps in which a tip end of a bump is worn during the use, respectively.
Figure 6A:
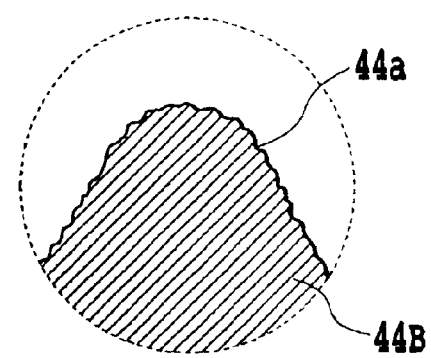
FIGS. 6A, 6B and 6C are partially enlarged views, respectively, of a tip end of a bump, made available for explaining the respective steps shown in FIGS. 5A, 5B and 5C in which the tip end of the bump is worn by using.

Prior to being used for such a test, the non-used each bump 44B originally has a generally conical shape as shown in FIG. 5A in an enlarged scale. At the topmost end of the bump 44B, micro-irregularity 44a is formed on the entirety of the surface thereof as shown in FIG. 6A in an enlarged scale.

Figure 5B:
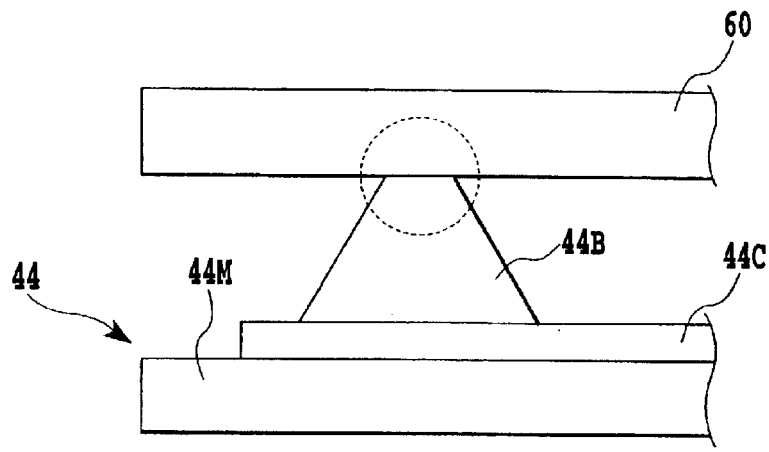
Figure 6B:
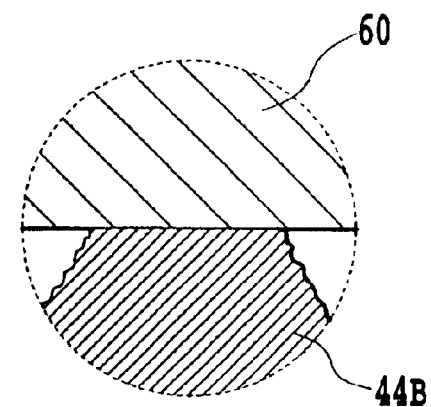

Next, when the contact sheet 44 is used for a test, the topmost end of the bump 44B is brought into contact with the electrode surface of the bare chip 60 at a predetermined pressure with a predetermined amount to be collapsed as shown in FIGS. 5B and 6B.

Figure 5C:
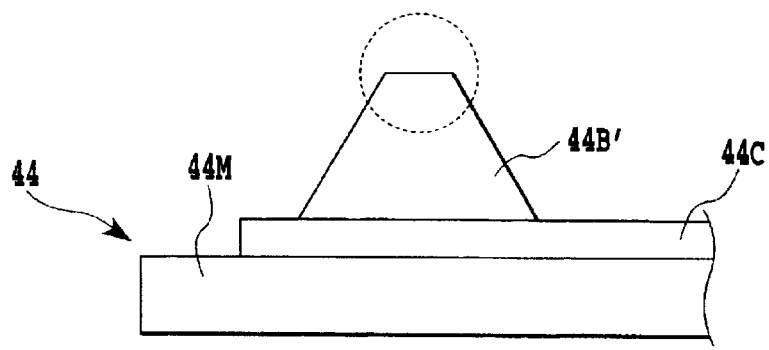
Figure 6C:
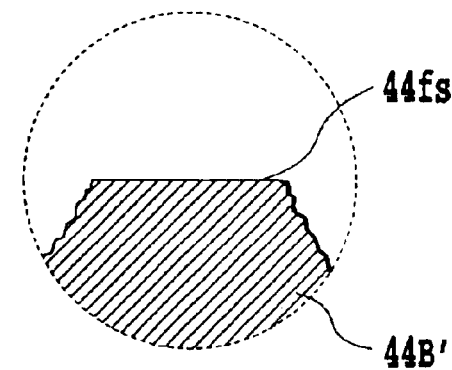

Subsequently, by repeatedly using one contact sheet 44 for a predetermined number of bare chips 60, the topmost end of the bump 44B' thus used is collapsed to be of a generally trapezoidal shape having a flat surface as enlargedly shown in FIGS. 5C and 6C. The smooth flat surface 44fs of such a bump 44B' does not have any micro-irregularity as shown in FIG. 6A.

Accordingly, when one contact sheet 44 has been used the predetermined number of times or more without changing the same, there might be a case in that the electric contact becomes unreliable between the contact sheet 44 and the bare chip 60.

Figure 1A:
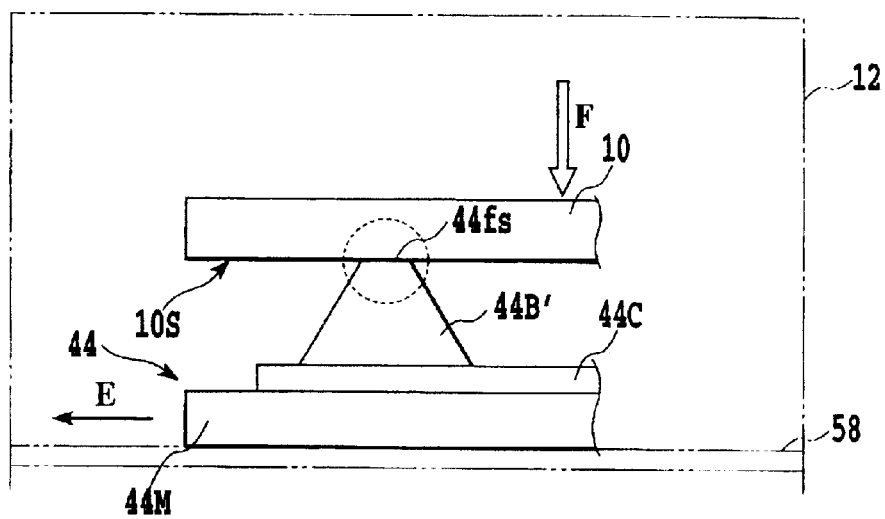
FIGS. 1A and 1B are schematic views of illustrating the respective steps of a first embodiment of a recovery processing method of an electrode according to the present invention, respectively.
Figure 2A:
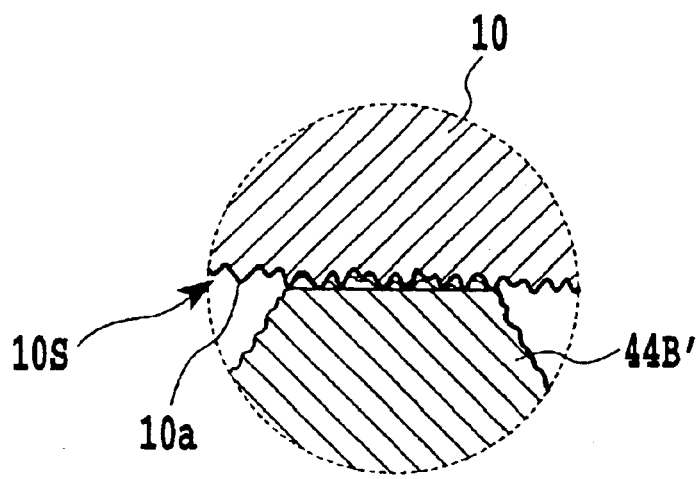
FIG. 2A is an enlarged partially sectional view of a tip end of a bump in the step shown in FIG. 1A, made available for explaining the respective step.

To solve such a problem, according to a first embodiment of a recovery processing method of an electrode according to the present invention, a transfer plate 10 having a predetermined thickness is prepared as shown in FIG. 1A. The transfer plate 10 is made of cold tool steel (Japanese Industrial standards mark SKS, SKD) plated with chromium as a surface treatment (having a coefficient of linear expansion of approximately $11.5 \times 10^{-6}/°$ C.), and has irregularity of a predetermined roughness on at least one transfer surface 10s as enlargedly shown in FIG. 2A.

First, the contact sheet 44, of which the bump 44B' is worn, is disposed as shown in FIG. 1A, and the above-mentioned carrier unit 40 on which is mounted the transfer plate 10 in place of the bare chip 60 is arranged in a constant temperature bath 12 for maintaining the room temperature at a predetermined value. The constant temperature bath 12 is provided with a temperature regulator capable of variously adjusting the room temperature.

At that time, the transfer plate 10 is placed on a common plane formed of a plurality of flat surfaces 44fs so that a transfer surface 10s thereof is brought into contact with worn flat surfaces 44fs of the respective bumps 44B' in the constant temperature bath 12. Thus, the transfer plate 10 is supported by the flat surfaces 44fs of a plurality of bumps 44B'. At that time, the transfer surface 10s is pressed onto the plurality of bumps 44B' at a predetermined pressure in the direction shown by an arrow F in FIG. 1A by a biasing force of the spring 54 via the press body 56 as above. This pressure is set, for example, at a value in a range from approximately 1 to 100 g per one bump 44B'. According to the study of the present inventors, if the pressure is less than approximately 1 g per one bump 44B', there is hardly a recovery effect, while if exceeding 100 g per one bump 44B', the projected height of the bump 44B' becomes too low in comparison with a standard value. In addition, in the latter case, since it has been proved that the collapse of the tip end of the bump 44B' becomes relatively large to damage the electrode of the device being tested, the pressure is selected from the above-mentioned range from approximately 1 to 100 g per one bump 44B', for example.

Figure 3A:
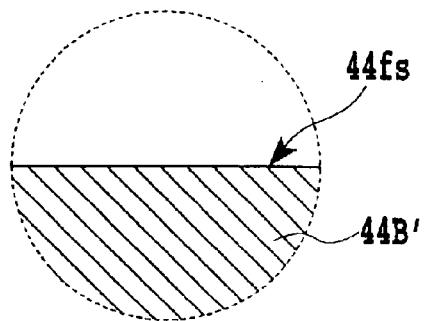
FIGS. 3A, 3B, 3C and 3D are enlarged partially sectional views, respectively, of a tip end of a bump in the respective steps of the first embodiment, made available for explaining the respective steps.
Figure 3B:
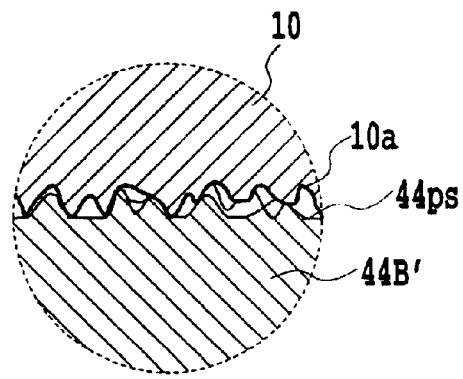

FIG. 3B illustrates the tip end of the bump 44B' in an enlarged scale, immediately after the transfer surface 10s has been brought into contact with the flat surface 44fs and pressed. Thus, as apparent from FIG. 3B, the tip end of the bump 44B' is pressed by the irregularity 10a of the transfer plate 10 to have a relatively rough irregularity 44ps.

Then, the temperature in the constant temperature bath 12 rises, for example, from a standard condition to a range from 80 to 150° C., and maintained at this temperature for not less than 5 minutes. In this regard, the temperature in the constant temperature bath 12 and the time period for maintaining this temperature are set preferably approximately 15 minutes at 150° C., respectively.

Figure 3C:
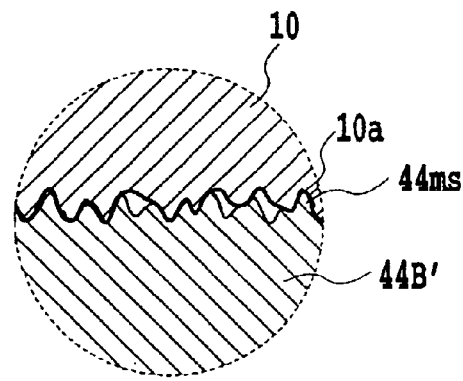

Accordingly, when the transfer plate 10 and the contact sheet 44 expand in the direction shown by an arrow E in FIG. 1A as the room temperature rises, the contact sheet 44 elongates longer than the elongation of the transfer plate 10 against the mutual frictional force between the irregularity 44ps and the transfer surface 10s shown in FIG. 3B, since the linear thermal coefficient of expansion of the substrate 44M is set to be larger than the coefficient of linear expansion of the transfer plate 10 as described above. As a result, the surface on which the irregularity 44ps is formed is further scraped by the relative slide of approximately several tens μm of the contact sheet 44 and the bump 44B' to the micro-irregularity 10a on the transfer surface 10s to result in a finer irregularity 44ms on the surface of the bump as shown in FIG. 3C.

Figure 1B:
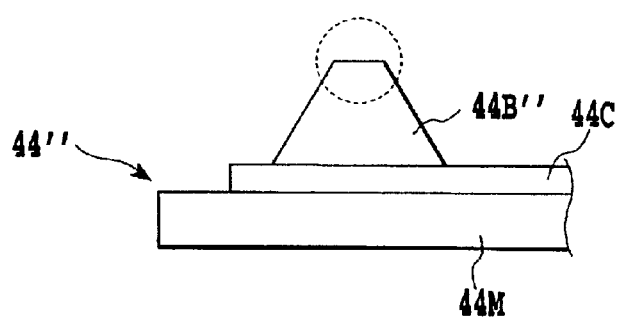

Subsequently, the contact sheet 44" having the bump 44B" subjected to the recovery treatment is removed from the carrier unit 40 as shown in FIG. 1B.

Figure 2B:
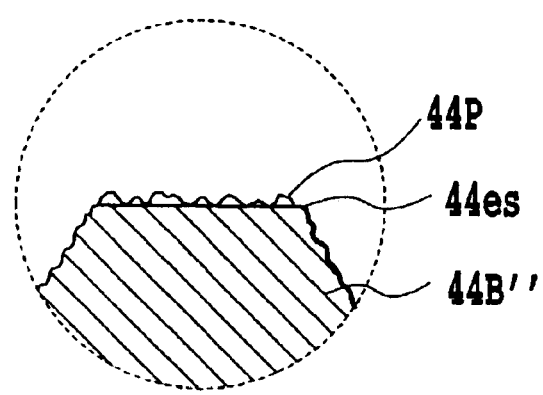
FIG. 2B is an enlarged partially sectional view of a tip end of a bump in the step shown in FIG. 1B, made available for explaining the respective step.
Figure 3D:
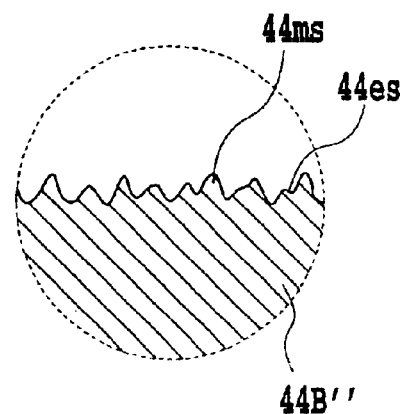

Thus, as shown in FIGS. 2B and 3D in an enlarged scale, a relatively fine irregularity 44ms is formed in the topmost end surface 44es of the bump 44B" in correspondence to the press and slide of the micro-irregularity 10a of the transfer surface 10s in the transfer plate 10 without applying a relatively large pressure.

As described above, since the bump 44B is easily deformable by the heating, the formation of the above irregularity is further facilitated.

Figure 4A:
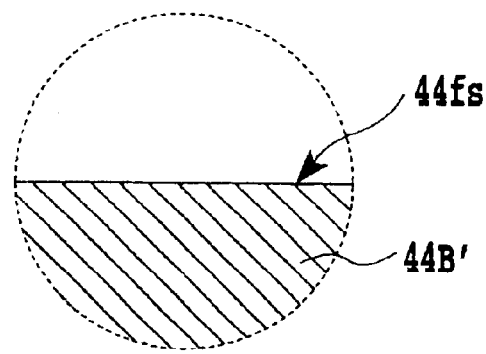
FIGS. 4A, 4B and 4C are enlarged partially sectional views, respectively, of a tip end of a bump in the respective steps of a comparative example, made available for explaining the respective steps.
Figure 4B:
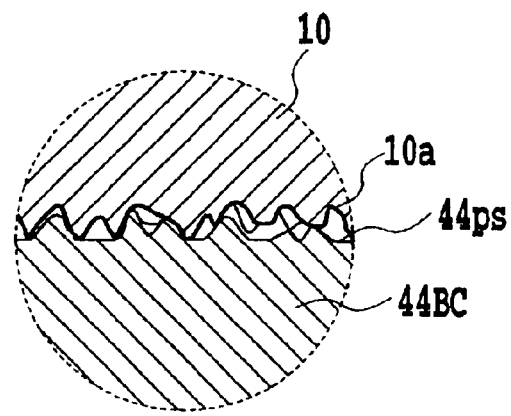
Figure 4C:
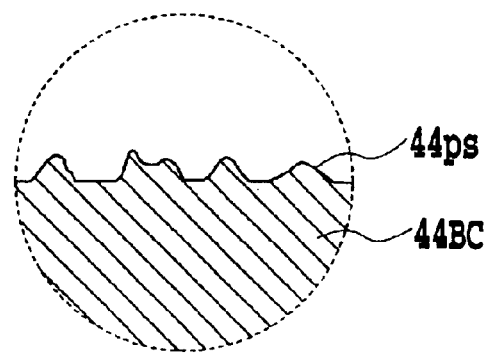

FIGS. 4A, 4B and 4C illustrate the respective steps for processing the bump 44B' in a comparative example proved by the present inventors.

In this comparative example, upon the recovery treatment of the electrode, the contact sheet 44 having the worn bump 44B' as shown in an enlarged scale in FIG. 4A similar to the above embodiment is disposed in the carrier unit 40 as in the above-described embodiment, and the transfer plate 10 is solely mounted in place of the bare chip 60 without being heated.

In this comparative example, the bump 44B' is pressed by the transfer plate 10 at a predetermined pressure in the direction shown by an arrow F in FIG. 1A by the bias of the spring 54 via the press body 56. FIG. 4B illustrates the tip end of the bump 44BC in an enlarged scale immediately after the transfer surface 10s is brought into contact with the flat surface 44fs and pressed thereby. Thereby, as apparent from FIG. 4B, the tip end of the bump 44BC is pressed by the irregularity 10a of the transfer plate 10 and a relatively rough irregularity 44ps is formed.

Next, the contact sheet having the recovered bump 44BC is removed from the carrier unit.

Thus, as shown in FIG. 4C in an enlarged scale, a relatively rough irregularity 44ps is formed in the topmost end surface of the bump 44BC in correspondence to the micro-irregularity 10a of the transfer surface 10s in the transfer plate 10.

As a result, it has been confirmed that the relatively fine irregularity 44ms as obtained by the first embodiment of the present invention is not obtainable by the method according to the comparative example.

In addition, in the present invention, the filing effect is obtained in the connection surface of the bump 44B by the relative slide between the above-mentioned transfer surface 10s and the bump 44B. Further, in comparison with a case in which the transfer is carried out only by the press action, it is possible to assuredly form the finer irregularity.

Figure 10A:
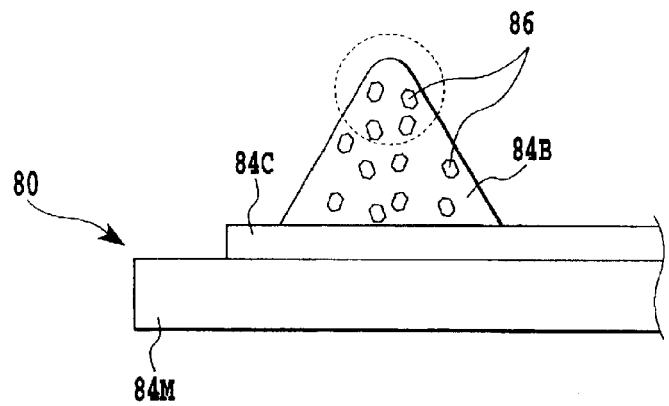
FIGS. 10A, 10B and 10C are enlarged partially sectional views, respectively, of a important portion made available for explaining the respective steps in a second embodiment of a recovery processing method of an electrode according to the present invention.
Figure 10B:
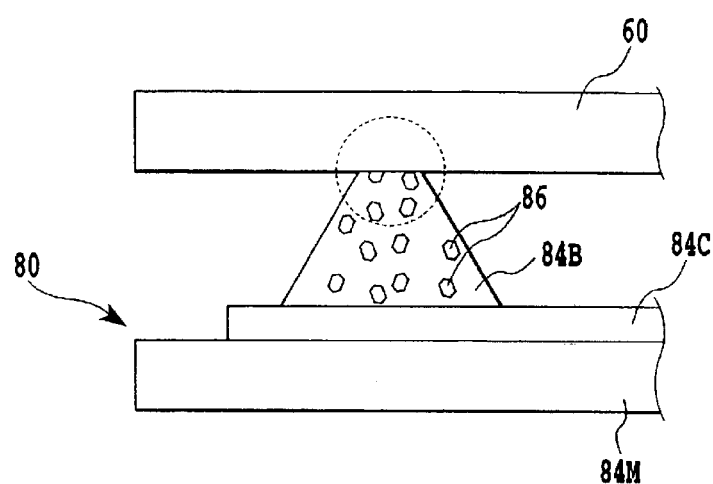
Figure 10C:
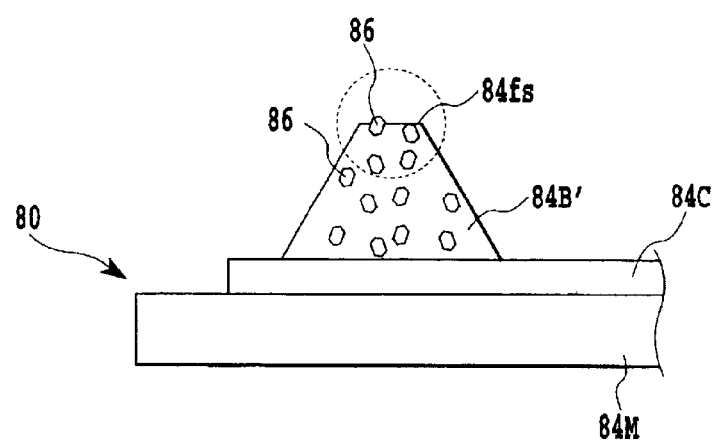

FIGS. 10A, 10B and 10C schematically illustrate the respective steps in the second embodiment of a recovery processing method of an electrode according to the present invention.

Figure 11A:
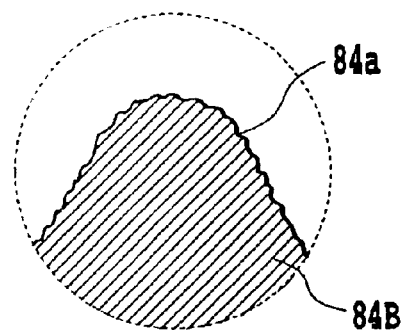
FIGS. 11A, 11B and 11C are enlarged partially sectional views, respectively, of a portion shown in FIGS. 10A, 10B and 10C.

A contact sheet 80 used in the embodiment shown in FIGS. 10A to 10C has a plurality of bumps 84B arranged in a substrate 84M in correspondence to an electrode group of a bare chip 60 to be electrically connected thereto as shown in FIG. 10A. A tip end of the respective bump 84B is projected at a predetermined height from the surface of the substrate 84M. A micro-irregularity 84a is formed over the entirety of the surface of the tip end thereof as shown in FIG. 11A in an enlarged scale.

The respective bump 84B is electrically connected to a pad (not shown) via a conductive layer 84C formed of copper foil. The pad is formed at each of the opposite ends of the substrate 84M projected from each of the opposite ends of the base member 42. The respective bump 84B is formed of material in which gold (having Knoop hardness in a range from 80 to 200) or copper (having Knoop hardness in a range from 250 to 320) is used as a base material and uniformly mixed with predetermined crystalline materials 86, to have a generally conical shape.

When the base material is gold, the crystal particle 86 is made of palladium (Pd) to have a diameter approximately in a range from 2 to 3 μm, which has a hardness higher than that of gold and a relatively high electric conductivity, and the content thereof is approximately in a range from 12 to 20%/vol.

When the base material is copper, the crystal particle 86 is made of nickel (Ni) to have a diameter approximately in a range from 2 to 3 μm, which has a hardness higher than that of copper and a relatively high electric conductivity, and the content thereof is approximately in a range from 15 to 20%/vol.

The substrate 84M is made, for example, of polyimide resin (having a coefficient of linear expansion of $35 \times 10^{-6}$/° C.) to be a sheet of approximately 40 μm in thickness.

Upon the recovery treatment of the bump 84B as an electrode of such a concrete sheet 80, while one contact sheet 80 is disposed in the above-mentioned carrier unit 40, the tip end of the bump 84B is repeatedly brought into contact with the bare chips 60 during the use, whereby the connection surface of the tip end of the bump 84B is automatically recovered. Accordingly, the pressing step and the heating step of the transfer plate 10 used in the first embodiment becomes unnecessary.

Figure 11B:
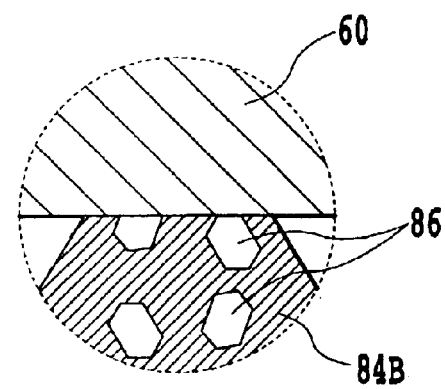

That is, when the contact sheet 80 in the carrier unit 40 is subjected the test, the topmost end of the bump 84B is brought into contact with the electrode surface of the bare chip 60 at a predetermined pressure with a predetermined amount to be collapsed as shown in FIGS. 10B and 11B in an enlarged scale.

Figure 11C:
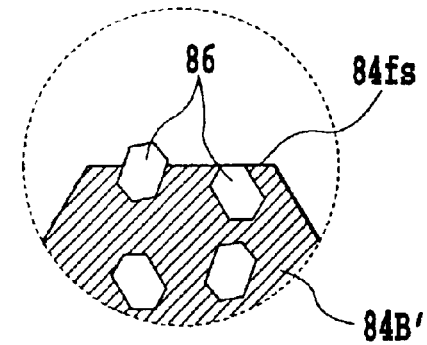

Subsequently, while the one contact sheet 80 is repeatedly used for testing a predetermined number of bare chips 60, the topmost end of the respective bump 84' is collapsed to be a generally trapezoidal shape having a generally flat surface as shown in FIGS. 10C and 11C in an enlarged scale. Part of the plurality of crystalline materials 86 contained in the base material is exposed on the tip end surface 84fs of such a bump 84B' as shown in FIG. 11C by the wear of the base material to form micro-irregularity.

Accordingly, a fresh surface having micro-irregularity is automatically formed on the topmost end surface of the respective bump 84B' as the base material at the topmost end of the bump 84B' is worn.

In the carrier unit 40 used in the first embodiment of a recovery processing method of an electrode according to the present invention, a portion in the contact sheet 44 in which a plurality of bumps 44B are formed is supported to be movable relative to the surface of the base member 42 in a predetermined range.

However, the carrier unit 40 is not necessary to have such a structure, but may be of those shown in FIGS. 12A, 12B to FIGS. 14A, 14B.

Figure 12A:
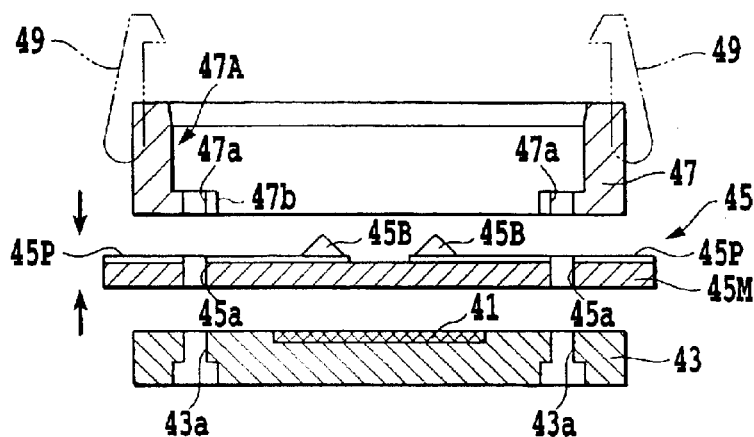
FIG. 12A is an exploded block diagram showing a structure of an example of another carrier housing and base member used in the first embodiment of a recovery processing method of an electrode according to the present invention.

In FIG. 12A, the carrier unit includes a carrier housing 47 having an accommodation portion 47A for receiving a bare chip 60 or a transfer plate 10, the contact sheet 45 placed via an elastic sheet 58 on a base member 42 forming a bottom of the accommodation portion 47A in the carrier housing 47, a pressing covering 52 (see FIG. 8) having a press body 56 for pressing an electrode group of the bare chip 60 or the transfer plate 10 to bumps 45B in the contact sheet 45, and a latch mechanism 49 for selectively holding the pressing covering 52 to the carrier housing 47. In this regard, since the structure of the pressing covering 52 and the latch mechanism 49 is the same as that of the pressing covering and the latch mechanism of the first embodiment, the explanation thereof will be eliminated.

Figure 12B:
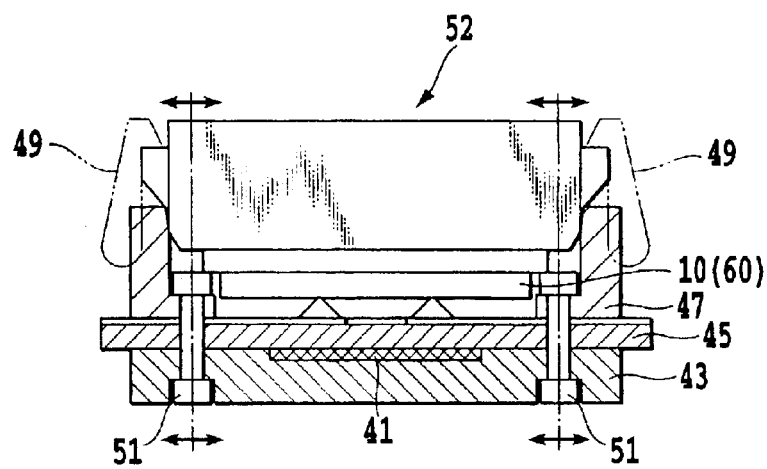
FIG. 12B is a block diagram illustrating a structure of a carrier unit including the carrier housing in FIG. 12A.

The carrier housing 47 is molded of material having the coefficient of linear expansion larger than that of the above-mentioned transfer plate 10, such as resinous material. Preferably, the resinous material is polyether imide (having the coefficient of linear coefficient of $56 \times 10^{-6}/°$ C.). As shown in FIG. 12B, the inner periphery of the accommodation portion 47A of the carrier housing 47 is formed to guide the outer periphery of the pressing covering 52 and located the cover at a predetermined position when the pressing covering 52 is mounted. On the bottom of the accommodation portion 47A of the carrier housing 47, four holes 47a are formed around a center opening 47b, in which are inserted fastener members 51 described later.

The contact sheet 45 has a plurality of bumps 45B in a substrate 45M arranged in correspondence to the electrode group of the bare chip 60 to be electrically connected to the bumps. A tip end of the respective bump 45B is projected from the surface of the substrate 45M at a predetermined height, for example. The respective bump 45B is formed by plating the surface of copper which is a base material thereof with nickel and gold. The substrate 44M is made, for example, of polyimide resin (having a coefficient of linear expansion of $35 \times 10^{-6}/°$ C.) to be a sheet form of approximately 40 μm in thickness.

The respective bump 45B is connected to a pad 45p via an conductive layer formed of a copper foil. The plurality of pads 44p are formed at each of opposite ends of the substrate 45M projected outward from the base member 43.

The contact sheet 45 has holes 45a in which are inserted fastener members 51 around a plurality of bumps 44B in correspondence to the holes 47a of the carrier housing 47.

The base member 43 is molded of the same material as that of the carrier housing 47 and has holes 43a in correspondence to the holes 47a of the carrier housing 47 and the holes 45a of the contact sheet 45.

One of roles of the elastic sheet 41 disposed directly beneath the plurality of bumps 44B of the contact sheet 45 is to equalize the variation of a contacting force of the bump 45B caused by the projected height of the respective bump 45B in the same manner as in the preceding embodiment.

As shown in FIG. 12B, the fastener member 51 for fastening the carrier housing 47 and the base member 43 together while intervening the contact sheet 45 between the both is preferably a rivet or a combination of bolt and nut, for example.

When such a carrier unit is used, upon the recovery treatment of the bump, the contact sheet 45 having the worn bumps is first placed thereon, and the carrier unit on which the transfer plate 10 is mounted in place of the bare chip 60 is put into the constant temperature bath 12 in which the room temperature is maintained at a predetermined value.

The condition of the pressure is determined in the same manner as in the preceding first embodiment.

Then, the room temperature in the constant temperature bath 12 rises from the standard condition to a range from 80 to 150° C. and is maintained at this temperature for 5 minutes or longer. The temperature in the constant temperature bath 12 and the period for maintaining the temperature are preferably 150° C. and 15 minutes.

Thus, when the transfer plate 10, the base member 43, the carrier housing 47 and the contact sheet 45 expand as the room temperature rises, the contact sheet 45 more relatively expands than the transfer sheet 45 against the mutual frictional force between the former and the transfer surface 10s because the coefficient of linear expansion of the carrier housing 47 or others is set to be larger than that of the transfer plate 10. As a result, since the respective bump 45B moves together with the contact sheet 45 in the same manner as in the first embodiment, irregularities having finer surface roughness is formed at a tip end of the respective bump 45B.

Figure 13A:
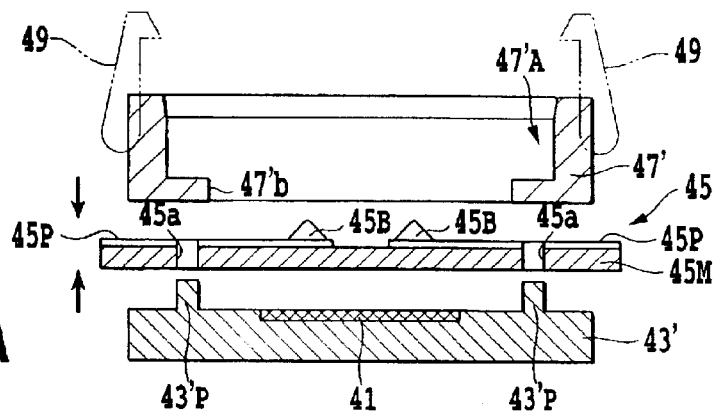
FIG. 13A is an exploded block diagram showing a structure of an example of a further carrier housing and base member used in the first embodiment of a recovery processing method of an electrode according to the present invention.
Figure 13B:
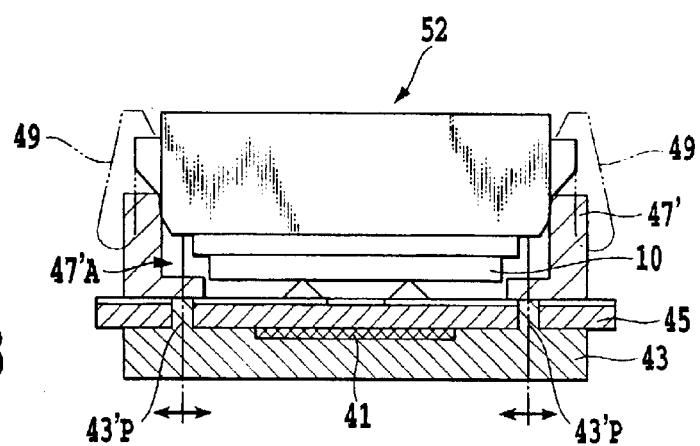
FIG. 13B is a block diagram illustrating a structure of a carrier unit including the carrier housing in FIG. 13A.

FIGS. 13A and 13B illustrate another carrier unit used in one embodiment of a recovery processing method of an electrode according to the present invention.

While the carrier housing 47 and the base member 43 are fastened together by the fastener members 51 while intervening the contact sheet 45 between the both in the carrier unit shown in FIGS. 12A and 12B, the carrier housing 47 and the base member 43 are bonded together by an adhesive or welding while intervening the contact sheet 45 between the both in the carrier unit shown in FIGS. 13A and 13B. In this regard, in FIGS. 13A and 13B, the same reference numerals are used for denoting the same elements as in FIGS. 12A and 12B and the explanation thereof will be eliminated.

The carrier housing 47' is molded of material having the coefficient of linear expansion larger than that of the above-mentioned transfer plate 10, such as resinous material. As the resinous material, polyether imide (having the coefficient of linear expansion of $56 \times 10^{-6}/°$ C.) is preferable, for example. The inner periphery of the accommodation portion 47' B is formed to guide the outer periphery of the pressing covering 52 to locate the same at a predetermined position as shown in FIG. 13B when the pressing covering 52 is mounted. In the bottom surface of the accommodation portion 47' of the carrier housing 47', an opening 47' b is formed at a center thereof.

The base member 43' is molded of the same material as that of the carrier housing 47', and has four positioning pins 43' P in correspondence to the holes 45a of the contact sheet 45, respectively. The positioning pin 43' P is projected from the surface on which the elastic sheet 41 is arranged at a predetermined length, for example, that corresponding to a thickness of the contact sheet 45. The positioning pin 43' P determines a relative position of the contact sheet 45 to the base member 43' and displaces the contact sheet 45 in accordance with the thermal expansion or shrinkage of the base member 43' in the same manner. The relative position of the base member 43' to the accommodation portion 47' of the carrier housing 47' is determined when being welded.

Also in this embodiment, since the coefficient of linear expansion of the base member 43', the carrier housing 47' and the contact sheet 45 is selected to be larger than that of the transfer plate 10, the contact sheet 45 extends larger than the elongation of the transfer plate 10 against the mutual frictional force between the contact sheet and the transfer surface 10s. As a result, in the same manner as in the first embodiment, the respective bump 45B moves together with the contact sheet, and a finer surface roughness is formed at a tip end of the respective bump 45B.

Figure 14A:
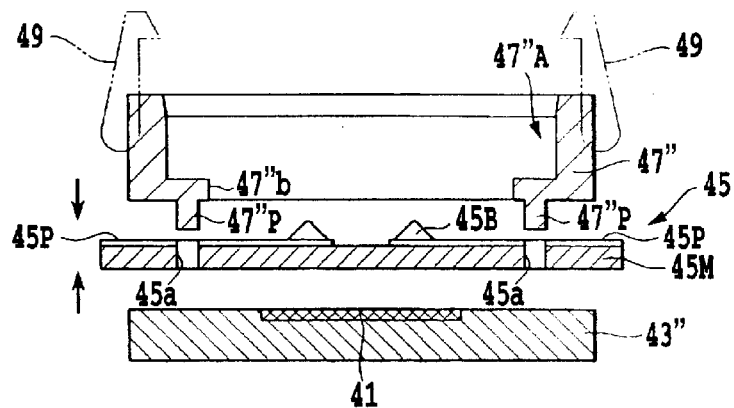
FIG. 14A is an exploded block diagram showing an example of a furthermore carrier housing and base member used in the first embodiment of a recovery processing method of an electrode according to the present invention.
Figure 14B:
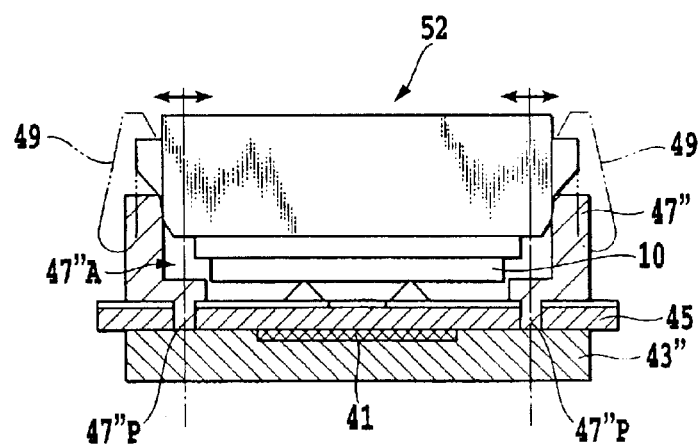
FIG. 14B is a block diagram illustrating a structure of a carrier unit including the carrier housing in FIG. 14A.

FIGS. 14A and 14B shows a further carrier unit used in one embodiment of a recovery processing method of an electrode according to the present invention.

The carrier housing 47' and the base member 43' having the positioning pins 43' P are bonded together while intervening the contact sheet 45 between the both in the carrier unit shown in FIGS. 13A and 13B. On the other hand, in FIGS. 14A and 14B, a carrier housing 47" having positioning pins 47" P and a base member 43" are bonded together while intervening the contact sheet 45 between the both. In this regard, in FIGS. 14A and 14B, the same reference numerals are used for denoting the same elements in FIGS. 12A and 12B, and the explanation thereof will be eliminated.

The carrier housing 47" is molded of material having the coefficient of linear expansion larger than that of the above-mentioned transfer plate 10, such as resinous material. Preferably, the resinous material is polyether imide (having the coefficient of linear coefficient of $56 \times 10^{-6}/°$ C.). As shown in FIG. 14B, the inner periphery of the accommodation portion 47" A of the carrier housing 47" is formed to guide the outer periphery of the pressing covering 52 and located the cover at a predetermined position when the pressing covering 52 is mounted. On the bottom of the accommodation portion 47" A of the carrier housing 47", an opening 47" b is formed at a center thereof. Four positioning pins 47" P are projected on the outer periphery of the opening 47". The positioning pin 47" P is projected from the bottom at a predetermined length, for example, that corresponding to a thickness of the contact sheet 45. The positioning pin 47" P determines a relative position of the contact sheet 45 to the carrier housing 47' and displaces the contact sheet 45 in accordance with the thermal expansion or shrinkage of the carrier housing 47" in the same manner. The relative position of the carrier housing 47" to the accommodation portion 47' of the carrier housing 47" is determined when being welded.

The base member 43" is molded of the same material as that of the carrier housing 47".

Also in this embodiment, since the coefficient of linear expansion of the base member 43", the carrier housing 47" and the contact sheet 45 is selected to be larger than that of the transfer plate 10, the contact sheet 45 extends larger than the elongation of the transfer plate 10 against the mutual frictional force between the contact sheet and the transfer surface 10s. As a result, in the same manner as in the first embodiment, the respective bump 45B moves together with the contact sheet, and a finer surface roughness is formed at a tip end of the respective bump 45B.

Figure 15:
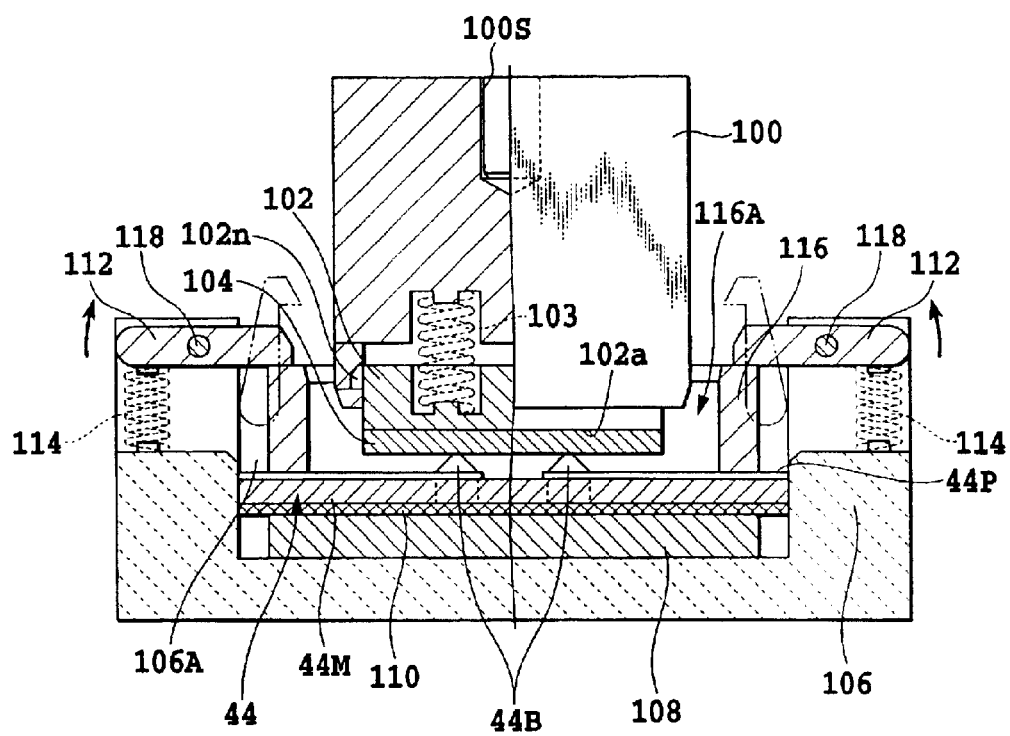
FIG. 15 is a sectional view illustrating a structure of a carrier unit stage together with a transfer plate fixing head used in a third embodiment of a recovery processing method of an electrode according to the present invention.
Figure 16:
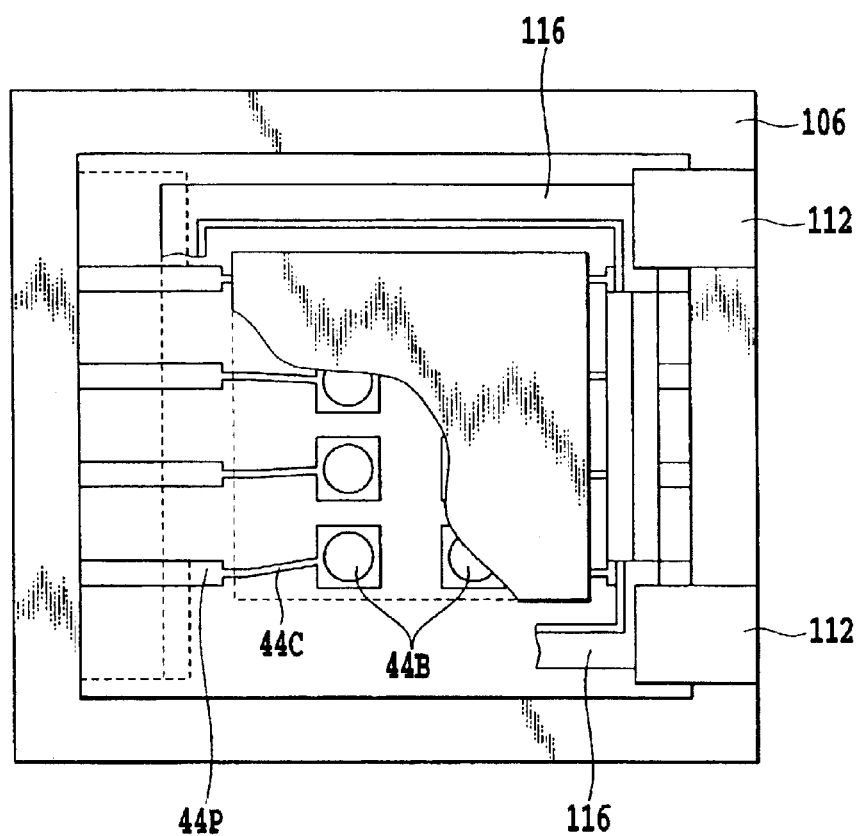
FIG. 16 is a plan view of the embodiment shown in FIG. 15.

FIGS. 15 and 16 illustrate a carrier unit stage together with a transfer plate fixing bead used in a third embodiment of a recovery processing method of an electrode according to the present invention.

In this regard, in FIGS. 15 and 16, the same reference numerals are used for denoting the same elements in FIGS. 7 and 8, and the explanation thereof will be eliminated. Also, in FIGS. 15 and 16, a state is illustrated in which part of constituent elements of the carrier unit are held in the carrier unit stage while the pressing covering is removed.

Figure 17:
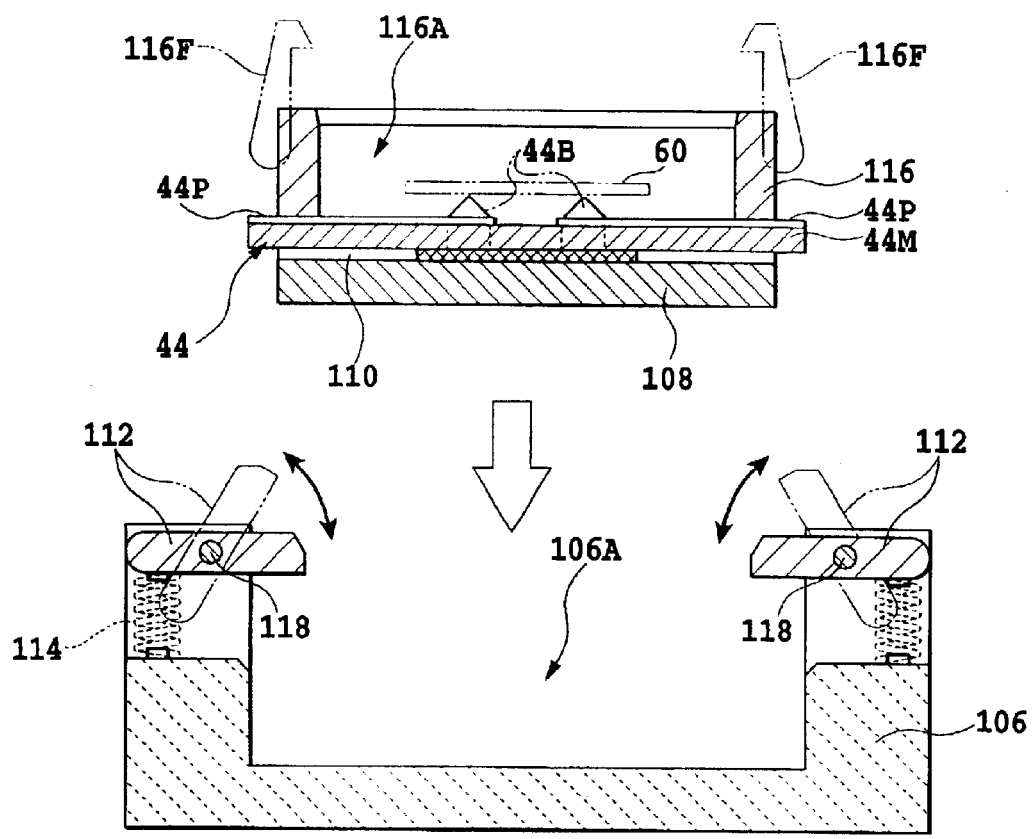
FIG. 17 is an exploded block diagram illustrating a structure of the carrier housing and the carrier unit stage shown in FIG. 15.

As part of the carrier unit is shown in FIGS. 15 and 17, the carrier unit includes a carrier housing 116 having an accommodation portion 116A for receiving a bare chip 60, the contact sheet 44 placed via an elastic sheet 110 on a base member 108 forming a bottom of the accommodation portion 116A of the carrier housing 116, a pressing covering (not shown) having a press body for pressing an electrode group of the bare chip 60 to bumps 44B in the contact sheet 44, and a latch mechanism 116F for selectively holding the pressing covering on the carrier housing 116.

In this regard, the above-mentioned pressing covering not shown has the same structure as in the embodiment shown in FIG. 8.

The latch mechanism 116F has a hook member at each of the opposite ends of the carrier housing 116 held for rotation by a pin as shown in FIG. 7, for holding an end of the pressing covering, and a coil spring for biasing the hook member in the direction to be engaged with the end of the pressing covering.

The carrier unit stage 106 has an accommodation portion 106 for temporarily accommodating the carrier housing 116 upon the recovery treatment of the bump 44B in the contact sheet 44. As shown in FIGS. 15 and 17, the inner periphery of the accommodation portion 106A opening upward is formed to be engaged with an end of the base member 108 for restricting a position of the base member 108 relative to the base member 108.

On the periphery of the accommodation portion 106A, a pair of latch mechanisms are opposed to each other for detachably holding the carrier housing 116 of the carrier unit as shown in FIGS. 16 and 17. The latch mechanism has a hook member 112 for holding the periphery of the accommodation portion 116A in the carrier housing 116, and a coil spring 114 for biasing the hook member 112 in the direction to be engaged with the periphery of the accommodation portion 116A. The hook member 112 is supported for rotation on the wall defining the accommodation portion 106A in the carrier unit stage 106 by a pin 118.

The hook member 112 is made to rotate when the carrier housing 116 of the carrier unit is solely mounted to the accommodation portion 106A or removed from the accommodation portion 106A, so that one end thereof is apart from the interior of the accommodation portion 106A against the bias of the coil spring 114 as shown by a chain double-dashed line in FIG. 17. On the other hand, when the carrier housing 116 is held in the interior of the accommodation portion 106A, one end of the hook member 112 is brought into contact with the periphery of the accommodation portion 116A of the carrier housing 116 by the bias of the coil spring 114 as shown by a solid line in FIGS. 15 and 17.

As described later, the transfer plate fixing head is disposed in the accommodation portion 116A of the carrier housing 116 as shown in FIG. 15 when the recovery processing is carried out on the contact sheet 44 having the worn bumps.

As shown in FIG. 15, the transfer plate fixing head has a press body 102 having a fixing surface 102a on which the transfer plate 104 is fixed, a covering body 100 having a recess for receiving a base of the press body 102, and a plurality of springs 103 for biasing the transfer plate 104 toward the bumps 44B of the contact sheet 44. The respective spring 103 is arranged in each of spaces defined between a recess in the base of the press body 102 and the relatively deep recess in the covering body 100.

The base of the base of the press body 102 is inserted to be movable into the relatively shallow and wide recess in the covering body 100. At an end of the inserted portion of the press body 102, a plurality of nibs 102n to be engaged with nibs provided at a lower end of the covering body 100 are opposed to each other. Thereby, the press body 102 is held by the covering body 100 while being held by the bias of the plurality of springs 103.

One surface of the transfer plate 104 made of metal or ceramic is fixed to the fixing surface 102a by an adhesive or fastening means. On the other surface of the transfer plate 104, an irregularity having a predetermined flatness and surface roughness is formed. In this regard, the transfer plate 104 should not be limited to this embodiment but may be formed to be integral with the press body 102. Also, the press body 102 may be formed to be integral with the covering body 100 without the intervention of the plurality of springs 103.

On the other hand, when the test is carried out on the bare chip 60, a pressing covering (not shown) of the carrier unit is held to the carrier housing 116 by the latch mechanism 116F thereof.

At a generally center of an upper portion of the covering body 100, a female thread section 100s is provided to be screwed with a male thread section in a load cell described later.

Figure 18A:
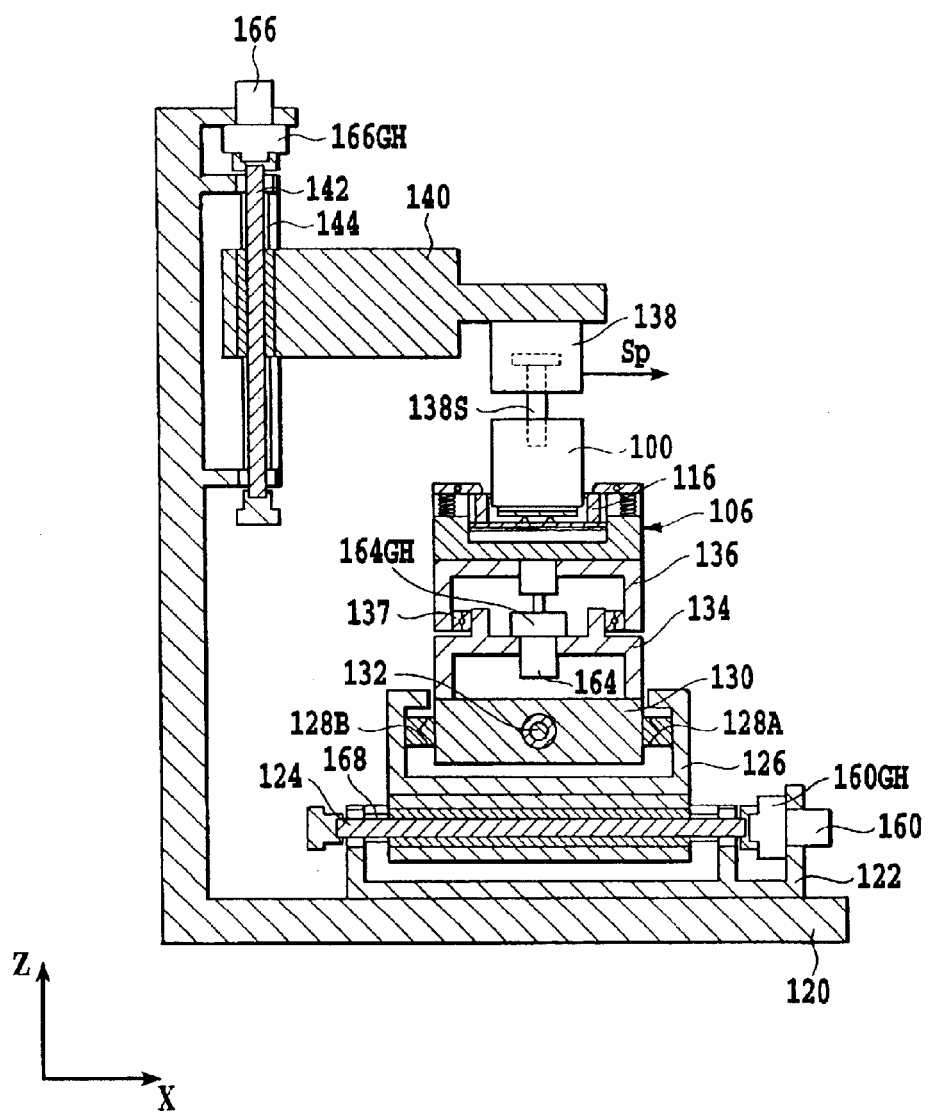
FIGS. 18A, 18B is a block diagram illustrating the entire structure of a sliding device used in the third embodiment of a recovery processing method of an electrode according to the present invention.

FIG. 18A schematically illustrated the entirety of a sliding device for moving the contact sheet 44 relative to the transfer plate fixing head in the step of the recovery processing for the bumps 44B on the contact sheet 44 in the third embodiment of a recovery processing method of an electrode.

The sliding device includes a table mechanism disposed on the base member 120 for fixing the carrier unit stage 106 holding the carrier housing 116 in which the contact sheet 44 is accommodated and moving the carrier unit stage 106 in a predetermined direction, and a press mechanism for holding the transfer plate fixing head and applying a predetermined pressure onto the transfer plate 104 and the bumps 44B on the contact sheet 44.

The table mechanism has a base 122 disposed on the base member 120, an X-directional stage member 126, a Y-directional stage member 130 and a rotary stage 136. The X-directional stage member 126 is made to move by a ball screw member 124 supported on the base 122. The Y-directional stage member 130 is made to move by a ball screw member 132 supported by the X-directional stage member 126 in the direction generally vertical to the axial direction of the ball screw member 124. Further, the, rotary stage 136 holds the carrier unit, while being supported for rotation by a stage supporting section 134 disposed on the Y-directional stage member 130.

The base 122 consists of a horizontal portion formed in the direction shown by an arrow X, and a vertical portion extended transverse to the horizontal portion in the direction shown by an arrow Z in FIG. 18A.

The X-directional stage member 126 is guided by a guide rail 168 and supported in a movable manner by a ball screw member 124 via a nut. Opposite ends of the ball screw member 124 are supported by the X-directional ends of the base 122 on the horizontal portion, respectively, in FIG. 18A. At one end of the ball screw member 124, an output shaft of a drive motor 160 fixed to the base 122 is coupled via a reduction mechanism 160GH such as a planetary gear train. The drive motor 160 may be a linear motor, a stepping motor, a servomotor or others, for example. The drive motor 160 and each of other motors described later are controlled by a control unit 150 described later.

The Y-directional stage member 130 is supported by a pair of guide rails 128A and 128B disposed opposite to each other on the inner periphery of the X-directional stage member 126 to be movable in the direction vertical to the paper surface. The Y-directional stage member 130 is supported in a movable manner by the ball screw member 132 via a nut. The opposite ends of the ball screw member 132 are supported by the opposite ends of the X-directional stage member 126, respectively, as seen in the direction vertical to the paper surface in FIG. 18A. At one end of the ball screw member 132, an output shaft of a drive motor 162 fixed to the X-directional stage member 126 is coupled via a reduction mechanism such as a planetary gear train. The drive motor 162 may be a linear motor, a stepping motor, a servomotor or others, for example.

At a center of a stage supporting section 134 fixed to the upper surface of the Y-directional stage member 130, a drive motor 164 is fixed. The stage supporting section 134 is fixed to the upper surface of the Y-directional stage member 130 via an opening of the X-directional stage member 126. An output shaft of the drive motor is coupled to the inside of a center hole of a disk portion in the rotary stage 136 via a reduction mechanism 164GH. A lateral wall of the rotary stage 136 is supported on the upper portion of the stage supporting section 134 via a bearing 137. The drive motor may be a linear motor, a stepping motor, a servomotor or others, for example.

Thereby, the rotary stage 136 is made to rotate about a central axis of the Y-directional stage member 130 and a central axis of the stage supporting section 134 when the drive motor 164 is in the operative state.

The carrier unit stage 106 is fixed to the disk portion of the rotary stage by fastening means not shown, such as screws.

The press mechanism includes a load cell 138 for detecting a pressure applied to the bump 44B via the transfer plate fixing head, a Z-directional stage member 140 for holding the load cell 138 and transmitting the pressure to the transfer plate fixing head, a ball screw member 142 fitted to the Z-directional stage member 140 to move the same, and a drive motor 166 for rotating the ball screw member 142.

Opposite ends of the ball screw member 142 are supported for rotation by a pair of brackets provided at a predetermined distance on the vertical portion. One end of the ball screw member 142 is coupled to an output shaft of a drive motor 166 fixed to the vertical portion via a reduction mechanism 166GH. The drive motor 166 may be a linear motor, a stepping motor, a servomotor or others, for example.

The Z-directional stage member 140 is fitted to the ball screw member 142 via a nut to be generally vertical to the axis thereof, and guided by a guide rail 144 while inhibiting the self-rotation.

Figure 18B:
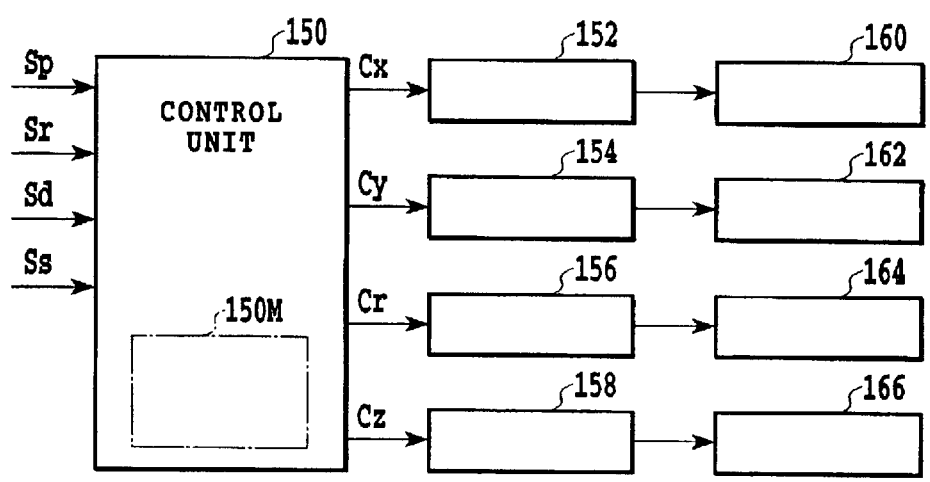

The load cell 138 is coupled to the covering body 100 by screwing the male thread section 138s coupled to an internal sensor part with the female thread section 100s of the transfer plate fixing head. The load cell 138 detects the pressure of the Z-directional stage member 140 applied to the transfer plate fixing head and issues a detection signal Sp representing the pressure to the control unit 150 as shown in FIG. 18B.

The following signals are fed to the control unit 150; a reset command signal Sr representing the command for returning the position of the respective stage member to a predetermined reference position, issued from a production-management host computer not shown, a moving-direction command signal Sd representing a direction in which the carrier housing 116 is to be moved, a recovery-treatment starting command signal Ss and the above-mentioned detection signal Sp from the load cell 138.

The control unit 150 is provided with a memory 150 in which are stored set values of the pressure applied to the transfer plate fixing head determined in accordance with the contact sheets 44, data representing displacements of the carrier housing 116 (carrier unit stage 106) or program data for carrying out the recovery treatment.

The pressure value is selected in accordance with sizes of the bump 44B, for example, in a range from 1 to 100 g per one electrode. In one example, a lower limit of the pressure value is in the range from 1 to 40 g.

The displacement of the carrier housing 116 (the carrier unit stage 106) in one direction is set by taking a play in the respective mechanism, a deflection of the contact sheet 44 or others into consideration so that the relative displacement of the bump 44B is within a range from 1 μm to 1 mm, for example. In one example, the lower limit of the relative displacement of the bump 44B is within a range from 1 μm to 100 μm.

Upon the recovery treatment of the third embodiment of a recovery processing method of an electrode according to the present invention, the carrier unit stage 106 on which is attached the carrier housing 116 carrying the contact sheet 44 having the worn bumps is first held in the disk portion of the rotary stage 136 disposed at the reference position.

Then, the control unit 150 determines the displacement of the respective stage member based on the recovery-treatment staring command signal Ss, the moving-direction command signal Sd and the data stored in the memory 150, so that the displacement of the carrier housing 116 and the carrier unit stage 106 becomes the predetermined value.

At that time, the control unit 150 determines the displacement of the Z-directional stage 140 based on the detection signal Sp and the data of the pressures stored in the memory 150.

The control unit 150 forms a pulse control signal Cz in accordance with the determined displacement and feeds the same to a motor drive circuit 158. The motor drive circuit 158 issues a drive signal based on the pulse control signal Cz.

Subsequently, the control unit 150 forms pulse control signals Cx, Cy and Cr at least once for displacing the carrier housing 116 and the carrier unit stage 106 and feeds them to motor drive circuits 152, 154 and 156, respectively. The motor drive circuits 152, 154 and 156 feed drive signals to the drive motors 160, 162 and 164 based on the pulse control signals Cx, Cy and Cr, respectively.

Thereby, the bump 44B of the contact sheet 44 in the carrier housing 116 is displaced once relative to the transfer plate 104 in the predetermined direction at the predetermined distance.

Thus, in the same manner as in the first embodiment as above, a relatively fine irregularity is formed at the worn end of the bump in correspondence to the pressing and sliding of the micro-irregularity on the transfer surface of the transfer plate 104 without applying relatively great pressing force. This surface roughness height is in the range from approximately 0.001 to 5 μm at approximately 0.1 to 50 μm intervals, for example. The range as a lower limit is at approximately 0.1 to 50 μm intervals, in the height range from approximately 0.002 to 3 μm, for example.

In this embodiment, since no heating is necessary contrary ton the first embodiment, the control of the slide distance is easy during the recovery treatment and the treatment is completed in a shorter period, which is suitable for the mass-production.

The control unit 150 forms the pulse control signal Cz for releasing the pressure and feeds the same to the motor drive circuit 158.

The carrier housing 116 in which the recovered contact sheet is accommodated is removed from the carrier unit stage 106. At that time, the control unit 150 forms the control signals Cx, Cy, Cr and Cz for returning the respective stage members to the reference positions based on the control signal Sr fed thereto, and feeds the same to the motor drive circuits 152, 154, 156 and 158, respectively.

The removed carrier housing 116 is mounted in the accommodation portion in the IC socket 30 as a carrier unit after the bare chip 60 and the pressing covering have been mounted, in the same manner as in the preceding embodiment.

The present invention has been described in detail with respect to preferred embodiments, and it will now be apparent from the foregoing to those skilled in the art that changes and modifications may be made without departing from the invention in its broader aspects, and it is the invention, therefore, in the appended claims to cover all such changes and modifications as fall within the true spirit of the invention.

What is claimed is:

1. A recovery processing method of an electrode comprising:

a first step of placing a transfer plate having an irregular surface onto a connection surface of an electrode section formed on an insulation substrate of an electrode plate for the electric connection to a terminal section of a semiconductor device via said connection surface of said electrode section, so that said irregular surface of said transfer plate is brought into contact with said connection surface of said electrode section each other, wherein said transfer plate is formed of a material having the coefficient of linear expansion which is different from that of said insulation substrate of said electrode plate;

a second step of heating said transfer plate and said electrode plate at a predetermined temperature for a predetermined period while pressing said transfer plate placed on the connection surface of said electrode section in said first step toward the connection surface of said electrode section at a predetermined pressure; and a third step of separating said transfer plate from said electrode plate to form a predetermined irregularity on the connection surface of said electrode section.

2. A recovery processing method of an electrode as claimed in claim 1, wherein said predetermined temperature and period in said second step are set in the range from 80 to 150° C. and in the range from 5 to 15 minutes, respectively.

3. A recovery processing method of an electrode comprising:

a first step of placing a terminal section of a semiconductor device on a connection surface of an electrode section of an electrode plate having said electrode section formed on an insulation substrate, for the electric connection to the terminal section of the semiconductor device via the connection surface of said electrode section, wherein said electrode section containing, in a base material, a predetermined amount of micro-crystalline materials having a wear resistance higher than that of the base material, and a second step of wearing the connection surface of said electrode plate while contacting the terminal section of the semiconductor with the connection surface of said electrode plate to expose part of said crystalline materials and forming a predetermined irregularity on the connection surface.

4. A recovery processing method of an electrode as claimed in claim 3, wherein said crystalline materials is formed of palladium or nickel having a hardness higher than that of a copper as said base material and a relatively high electric conductivity.

5. A recovery processing method of an electrode comprising:
- a first step of placing a transfer plate having an irregular surface onto a connection surface of an electrode section formed on an insulation substrate of an electrode plate having the insulation substrate for the electric connection to a terminal section of a semiconductor device via the connection surface of the electrode section, so that the surface of said transfer plate is brought into contact with the connection surface of the electrode section each other,
- a second step of relatively moving said transfer plate or the connection surface of the electrode section at least once in either of directions generally parallel to the connection surface at a predetermined distance, while pressing said transfer plate placed on the connection surface of the electrode section in said first step toward the connection surface of the electrode section at a predetermined pressure, and
- a third step of separating said transfer plate from said electrode plate to form a predetermined irregularity on the connection surface of the electrode section.

6. A recovery processing method of an electrode as claimed in claim 5, wherein in said second step, said electrode plate is moved relative to said transfer plate by a sliding device for moving said electrode plate generally parallel to the connection surface of the electrode section while supporting said electrode plate thereby.

7. A recovery processing method of an electrode as claimed in claim 5, wherein the pressure in said second step is in the range from 1 to 100 g per one electrode.

8. A recovery processing method of an electrode as claimed in claim 5, wherein the distance of the relative movement in said second step is in the range from 1 $\mu$m to 1 mm.

9. A recovery processing method of an electrode as claimed in claim 1, wherein the electrode section is formed by plating a surface of copper which is a base material with nickel and gold.

10. A recovery processing method of an electrode as claimed in claim 1, wherein said insulation substrate is made of polyimide resin.

11. A recovery processing method of an electrode as claimed in claim 10, wherein said insulation substrate has a coefficient of linear expansion of $35 \times 10^{-6}/°$ C.

12. A recovery processing method of an electrode as claimed in claim 1, wherein said transfer plate is made of cold tool steel plated with chromium as a surface treatment.

13. A recovery processing method of an electrode as claimed in claim 1, wherein the linear thermal coefficient of expansion of said insulation substrate is set to be larger than the coefficient of linear expansion of said transfer plate.

14. A recovery processing method of an electrode as claimed in claim 5, said irregularity height in said third step is in the range from 0.001 to 5 $\mu$m at approximately 0.1 to 50 $\mu$m intervals.

* * * * *